(12) United States Patent
Oshikiri

(10) Patent No.: US 8,914,702 B2
(45) Date of Patent: Dec. 16, 2014

(54) BIT ERROR REPAIR METHOD AND INFORMATION PROCESSING APPARATUS

(75) Inventor: Takashi Oshikiri, Osaka (JP)

(73) Assignee: MegaChips Corporation, Osaka-shi (JP)

( * ) Notice: Subject to any disclaimer, the term of this patent is extended or adjusted under 35 U.S.C. 154(b) by 1098 days.

(21) Appl. No.: 12/020,187

(22) Filed: Jan. 25, 2008

(65) Prior Publication Data

US 2008/0215954 A1 Sep. 4, 2008

(30) Foreign Application Priority Data

Feb. 15, 2007 (JP) .................................. 2007-034848

(51) Int. Cl.
G11C 29/00 (2006.01)
G06F 11/10 (2006.01)
G11C 29/04 (2006.01)

(52) U.S. Cl.
CPC .... G06F 11/1068 (2013.01); G11C 2029/0411 (2013.01)
USPC ............ 714/763; 714/752; 714/764; 714/773

(58) Field of Classification Search
USPC ......................................... 714/763, 764, 773
See application file for complete search history.

(56) References Cited

U.S. PATENT DOCUMENTS

| | | | |
|---|---|---|---|
| 6,052,798 A * | 4/2000 | Jeddeloh ...................... | 714/6.13 |
| 6,131,177 A | 10/2000 | Takeuchi et al. | |
| 6,321,360 B1 | 11/2001 | Takeuchi et al. | |
| 7,405,985 B2 * | 7/2008 | Cernea et al. ................. | 365/200 |
| 2005/0097288 A1 * | 5/2005 | Holzmann ..................... | 711/162 |
| 2005/0210184 A1 | 9/2005 | Chen et al. | |
| 2005/0249010 A1 * | 11/2005 | Klein ............................ | 365/222 |
| 2007/0038901 A1 * | 2/2007 | Shiota et al. ................... | 714/54 |
| 2008/0148130 A1 * | 6/2008 | Eilert ............................. | 714/763 |
| 2008/0229164 A1 * | 9/2008 | Tamura et al. ................ | 714/721 |
| 2010/0191902 A1 * | 7/2010 | Yamagami et al. ........... | 711/103 |

FOREIGN PATENT DOCUMENTS

| | | |
|---|---|---|
| JP | 6-75864 | 3/1994 |
| JP | 6-110793 | 4/1994 |
| JP | 7-122087 | 5/1995 |
| JP | 10-97472 | 4/1998 |
| JP | 10-302485 | 11/1998 |

(Continued)

OTHER PUBLICATIONS

Jiang, Anxiao, Introduction to Flash Memories, CSCE 689: Frontiers in Storage Systems, Texas A&M University, Aug.-Dec. 2010, slide 15, http://faculty.cs.tamu.edu/ajiang/689_01.ppt.*

*Primary Examiner* — Justin R Knapp
(74) *Attorney, Agent, or Firm* — Oblon, Spivak, McClelland, Maier & Neustadt, L.L.P.

(57) ABSTRACT

An information processing apparatus has an error correction function for checking an error of stored data read out from a flash memory. If an error is found, error information thereof is temporarily stored into a register and then stored in a nonvolatile memory at an appropriate timing. At an appropriate timing such as power-on, the information processing apparatus reads the stored data in which the error is found again on the basis of the error information stored in the nonvolatile memory, corrects the error and then rewrites the stored data into the flash memory. It is thereby possible to repair a recoverable bit error such as a read disturb. Therefore, a normal read operation can be performed without a hitch, and this can avoid giving any uncomfortable feeling to users.

12 Claims, 5 Drawing Sheets

(56) References Cited

FOREIGN PATENT DOCUMENTS

| | | |
|---|---|---|
| JP | 3176019 | 4/2001 |
| JP | 2002-169660 | 6/2002 |
| JP | 2003-58432 | 2/2003 |
| JP | 2003-248631 | 9/2003 |
| JP | 2006-79229 | 3/2006 |

* cited by examiner

BIT ERROR REPAIR METHOD AND INFORMATION PROCESSING APPARATUS

BACKGROUND OF THE INVENTION

1. Field of the Invention

The present invention relates to a method of repairing bit errors which occur in nonvolatile semiconductor memories due to a read disturb or the like, and relates to an information processing apparatus for achieving the repair method.

2. Description of the Background Art

Nonvolatile semiconductor memories such as flash memories are heavily used for SD memory cards or the like for the purpose of achieving high integration, reduction in manufacturing cost and easy writing for users by simplifying circuit configurations and in recent, greatly adopted for game machines or the like.

In the game machines or the like, however, since flash memories are used like ROMs and specific data which are stored are repeatedly read out, it begins to be noticed that there is a possibility that bit data which are stored should change to cause errors and this should invite trouble. Such a phenomenon is termed "read disturb", and the mechanism of this phenomenon will be briefly discussed below.

FIG. 6 is a schematic diagram showing a NAND flash memory. The NAND flash memory is constituted of a bit line 41 and word lines 42, 43 and 44 which are arranged in a lattice manner, memory cells 52 and 53, a selection register 54 and the like.

For example, in a case where 1-bit data (bit data) of "0" or "1" stored in the memory cell 52 is read out, the memory cell 52 is a selected cell and the memory cell 53 is an unselected cell. First, the selection register 54 specifies the bit line 41 to which the selected cell 52 belongs. Next, a low gate voltage V(Low), e.g., 0 V, is applied to the word line 42 to which the selected cell 52 belongs. Then, a high gate voltage V(High), e.g., 5V, is applied to the word line 43 to which the unselected cell 53 belongs.

At that time, there is a possibility that electrons might be accumulated in a floating gate of the unselected cell 53. In other words, when bit data stored in the selected cell 52 is repeatedly read out, there is a possibility that electrons might be trapped and accumulated in the unselected cell 53 with time and bit data stored in the unselected cell 53 might be unintendedly rewritten, being changed from "1" to "0", to cause an error.

Even if the bit data stored in the unselected cell 53 is unintendedly rewritten, however, when data is erased from or written into the unselected cell 53, the unselected cell 53 can be recovered. But, if there occurs no write or erase operation in the unselected cell 53, the bit data in the unselected cell 53 is held with the error, and therefore trouble is caused when a program associated with the unselected cell 53 is executed.

Specifically, herein, a bit error refers to a reversible error caused by a change of the bit data stored in the cell with time, not an irreversible error due to a physical damage. Above all, the bit error due to the read disturb (i.e., read disturb error) is caused by repeated read operations in a specified memory area of a flash memory with no write or erase operation.

US Patent Application Publication No. 2005/0210184 discloses a technique to avoid the read disturb error. In this document, however, the bit error is avoided by controlling the inside of a memory cell.

Generally, flash memories are each provided with an error correction function. If data which is read out has any error, this error correction function corrects the error and outputs correct data. As the error correction function, for example, ECC (Error Check and Correct) is used. In the case of using the function of ECC, by installing an ECC (Error-Correcting Code) in a flash memory in advance, even when an error (including a bit error) occurs in the flash memory, if it is an error of several bits, the error can be checked and corrected before data is read out. Even if the stored data has any error, correct data is read out and therefore the reliability of the flash memory is ensured. In one case, for example, where 8-bit error correcting code is set for 64-bit data, when an error occurs, if it is an error of 1 bit, data can be outputted with the error corrected.

The bit error, however, occurs in the unselected cell around the selected cell in e.g., NAND flash memories, as discussed above. Therefore, it is very difficult to identify the location and the number of errors and there is a possibility that a lot of errors might occur. For this reason, it is thought that the risk to cause trouble beyond the correction capability of the conventional error correction function such as ECC is high. Further, this type of error correction function usually corrects only the error of data to be outputted but can not repair the nonvolatile semiconductor memories.

If repair of the nonvolatile semiconductor memories is done, it is a very important problem when to repair the memories, from the viewpoint of product characteristics. If the repair of the nonvolatile semiconductor memory is done during execution of a game, for example, a stress is imposed on the read operation of the game program to cause suspension or delay of the game, and this invites very uncomfortable conditions to users.

SUMMARY OF THE INVENTION

The present invention is intended for a method of repairing a bit error which occurs due to a change of bit data stored in a first nonvolatile semiconductor memory.

According to an aspect of the present invention, the method comprises the steps of a) judging whether there is an error in stored data which is stored in the first nonvolatile semiconductor memory or not when the stored data is read out and correcting the error if there is, b) storing error information of the stored data into a second nonvolatile semiconductor memory, and c) reading the stored data in which an error occurs out from the first nonvolatile semiconductor memory on the basis of the error information stored in the second nonvolatile semiconductor memory at a predetermined timing, correcting the error and then rewriting the stored data into the first nonvolatile semiconductor memory.

Since a function to repair recoverable bit errors is provided as a complement function of the error correction function, it is possible to reduce the risk that errors exceeding the error correction capability might occur and improve the reliability of the nonvolatile semiconductor memory.

Further, by storing the error information in the second nonvolatile semiconductor memory, it is possible to perform the bit error repair operation at an appropriate timing. This avoids giving any uncomfortable feeling to users due to the suspension or delay in execution of the various programs caused by the repair operation.

According to another aspect of the present invention, the step c) is performed at power-on.

It is therefore an object of the present invention to provide an effective method of repairing a bit error which occurs in a nonvolatile semiconductor memory without giving any uncomfortable feeling to users.

These and other objects, features, aspects and advantages of the present invention will become more apparent from the

DESCRIPTION OF THE PREFERRED EMBODIMENTS

Figure 1:
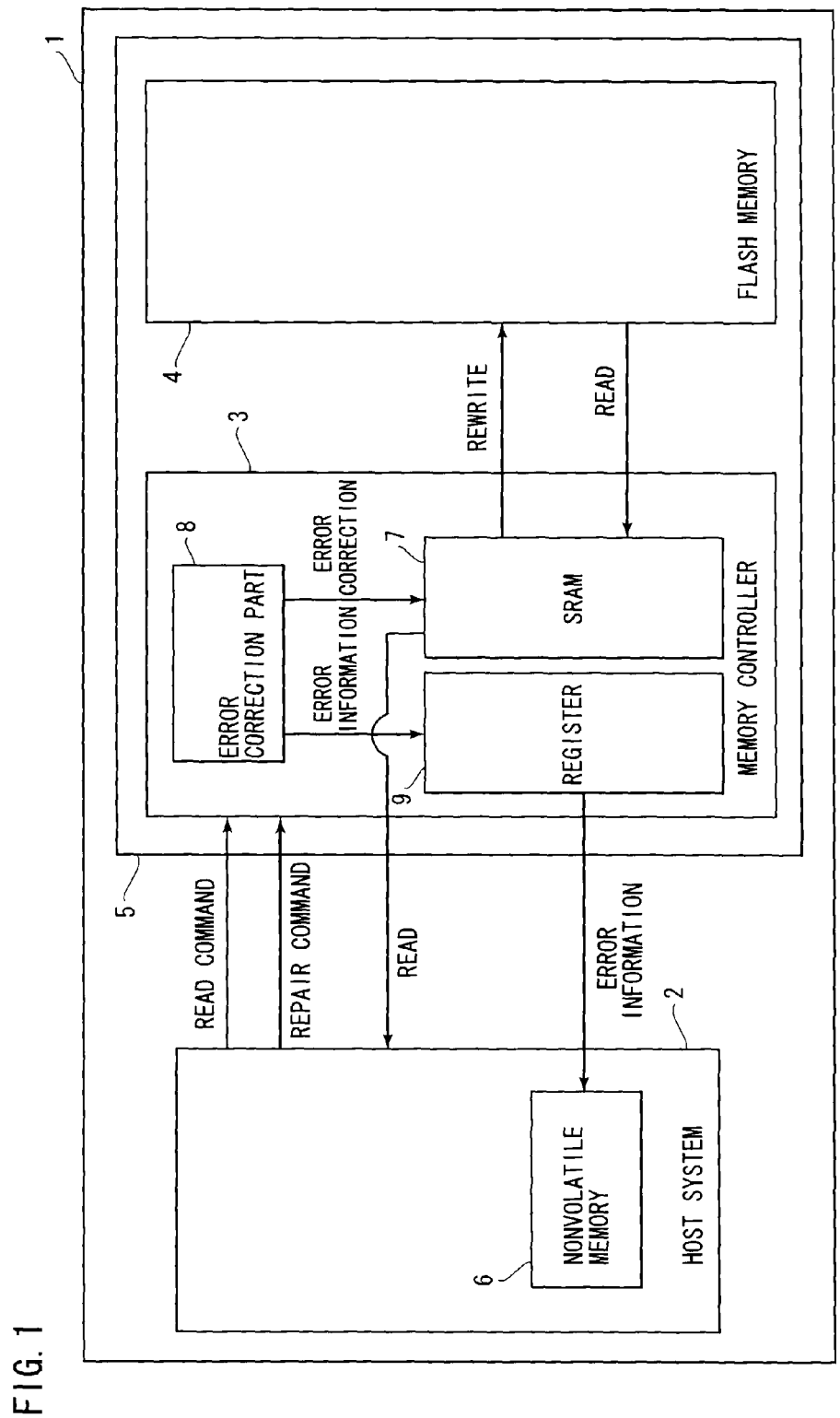
FIG. 1 is a block diagram showing a constitution of an information processing apparatus.

FIG. 1 is a block diagram showing a constitution of an information processing apparatus which achieves a bit error repair method in accordance with the present invention. As shown in FIG. 1, the information processing apparatus 1 is constituted of a host system 2, a memory controller 3, a first nonvolatile semiconductor memory (flash memory) 4 and the like. Among specific examples of the information processing apparatus 1 are game machines and the like.

In this preferred embodiment, discussion will be made on a case where a game machine is taken as an example of the information processing apparatus 1. In this case, the memory controller 3 and the flash memory 4 are mounted on a storage medium 5 such as a SD card as one unit and inserted detachably into the game machine as a form of a game cartridge. Further, the memory controller 3 and the flash memory 4 may be mounted on the information processing apparatus 1 as one unit.

<Host System>

The host system 2 is a central processing part for performing a general control on the information processing apparatus 1 and constituted of an operation part, a control part, a memory part, an input/output part and the like. Specifically, the information processing apparatus 1 comprises a CPU, a ROM, a monitor, an operation button and the like, and these constituent elements are controlled by the host system 2. The host system 2 performs, for example, an operation for reading a program of a game or the like which is stored in the flash memory 4 and an operation for displaying moving images of the game or the like on the monitor on the basis of the game program which is read out, in response to an instruction from the operation button which a user operates.

The host system 2 further comprises a second nonvolatile semiconductor memory (nonvolatile memory) 6. The nonvolatile memory 6 has a function of storing error information on errors (including bit errors) which occur in stored data which is stored in the flash memory 4. The detailed description thereof will be made later. Further, the nonvolatile memory 6 does not necessarily have to be included in the host system 2 but may be included in the storage medium 5.

<Memory Controller>

The memory controller 3 is a processing part for performing a read operation or the like for data stored into the flash memory 4 in response to a request from the host system 2. Specifically, the memory controller 3 has an interface function between the host system 2 and the flash memory 4 and performs an input/output operation of commands and data from/to the host system 2. The memory controller 3 reads data from the flash memory 4 and writes data into the flash memory 4 in response to the commands outputted from the host system 2 or on the basis of the function of itself.

The memory controller 3 comprises a temporary memory part 7 (SRAM: Static Random Access Memory) for temporarily storing data which is read out from the flash memory 4, an error correction part 8 for correcting an error existing in data stored in the temporary memory part 7 (temporarily stored data), a register 9 (nonvolatile storage part) consisting of nonvolatile memories for temporarily storing information on the error which is found in the temporarily stored data, and the like.

The memory controller 3 reads the stored data from the flash memory 4 and temporarily stores it into the temporary memory part 7 in response to a read request from the host system 2 if receives it. Then, the host system 2 reads the temporarily stored data which is stored in the temporary memory part 7. Before reading the temporarily stored data, if the temporarily stored data has an error, the error correction part 8 corrects the error and then, correct data can be outputted.

The error correction part 8 has a function on the basis of e.g., a well-known error correction function (ECC) and checks the temporarily stored data which is stored in the temporary memory part 7 with an error correcting code. Then, if the temporarily stored data has an error, the error correction part 8 performs an operation for correcting the error. Therefore, even if a storage area for the game program or the like stored in the flash memory 4 has a bit error, the error correction part 8 performs the error correction function to ensure the reliability of the flash memory 4. If the error correction part 8 has error correction capability within 4 bits in the temporarily stored data, for example, when an error of 2 bits or 3 bits occurs, correct data with its error corrected can be outputted.

Since the errors which exist in the flash memory 4, however, remain therein, if the errors are accumulated to exceed 4 bits, it becomes impossible to correct the errors. For this reason, by providing a function to repair repairable bit errors, the error correction function is complemented and it is possible to effectively perform the error correction function.

If the error correction part 8 finds an error in the temporarily stored data, the register 9 of this preferred embodiment temporarily stores its error information therein. Then, the error information stored in the register 9 is read out by the host system 2 at a predetermined appropriate timing and stored into the nonvolatile memory 6. Since a write operation of the error information into the nonvolatile memory 6 which takes time is performed at an appropriate timing by temporarily storing the error information in the register 9, it is possible to prevent deterioration in efficiency of reading the stored data.

<First Nonvolatile Semiconductor Memory>

The first nonvolatile semiconductor memory 4 is a rewritable nonvolatile semiconductor memory such as a flash memory. Among flash memories are, e.g., NOR flash memories and NAND flash memories. Above all, the NAND flash memories are suitable for the present invention, and therefore following discussion will be made on a case where the first nonvolatile semiconductor memory 4 is a NAND flash memory, but the first nonvolatile semiconductor memory 4 is not limited to a flash memory of this type. Further, if corrected data is not rewritten into the first nonvolatile semiconductor memory 4 but rewritten into one of the other memories, the first nonvolatile semiconductor memory 4 does not necessarily have to be rewritable.

The flash memory 4 stores data (stored data) therein, which constitute any one of various programs such as application programs of games or the like, and the memory area of the flash memory 4 has a data memory area for storing the stored data therein and a redundant area for storing error correction data such as an error correcting code or the like. The memory area consists of pages 10 each of which is a unit of reading and blocks 11 consists of a plurality of pages 10 and is a unit of erasing data (see FIGS. 3A to 3C).

In the memory area of the flash memory 4 provided are a use area 12 in which a game program or the like is stored and an unused area 13 in which no data is stored. Further, the flash memory 4 is provided with a management table such as a FAT (File Allocation Table) or the like (not shown), which manages storage information of data stored in the flash memory 4.

<Repair of Bit Error>

Next, specific discussion will be made on the repair of bit errors in the information processing apparatus 1 having the above constitution.

Figure 2:
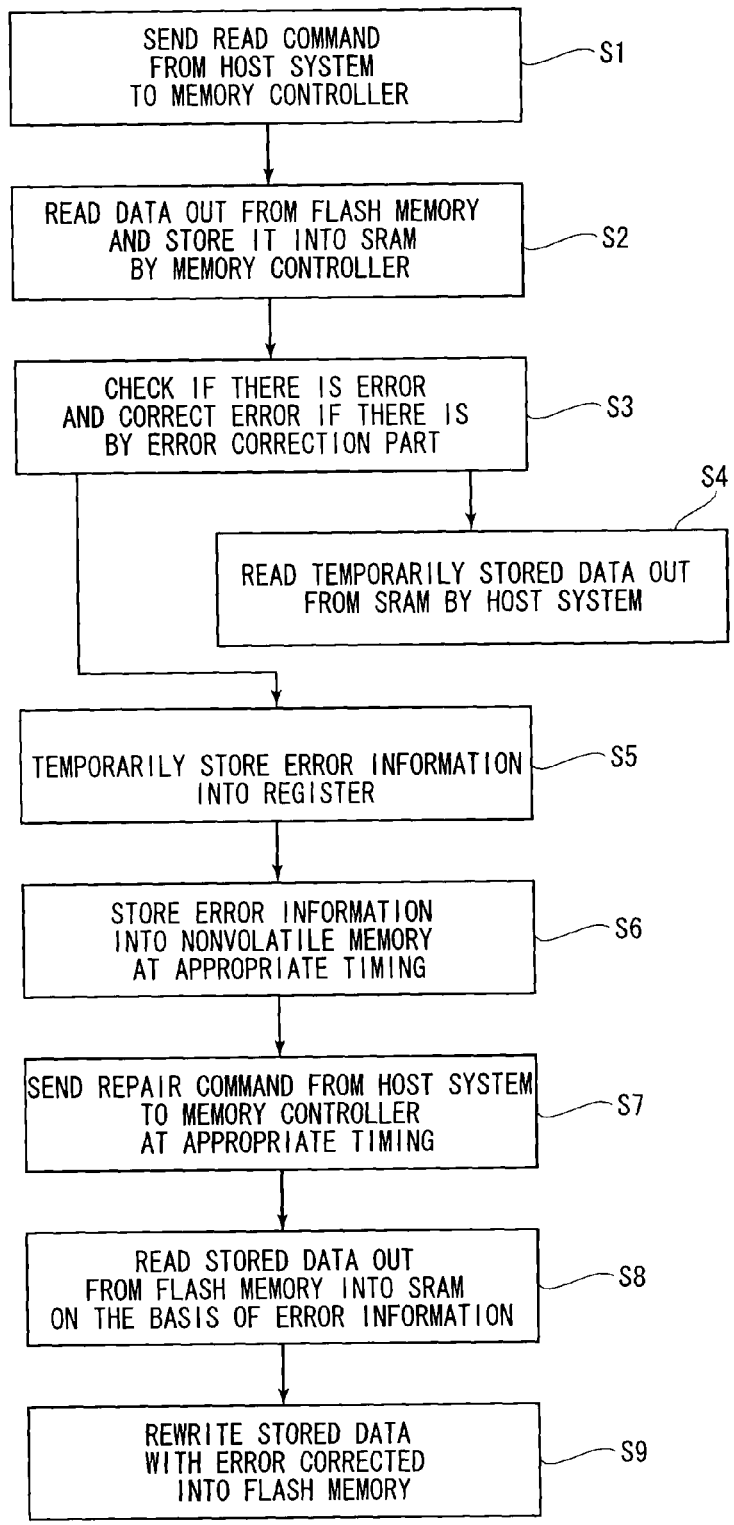
FIG. 2 is a flowchart showing a procedure of repairing a bit error.

FIG. 2 is a flowchart showing a procedure of repairing a bit error. In this preferred embodiment, in order to prevent the repair of bit errors from inviting uncomfortable conditions to users, there is some contrivance to perform the repair operation at a predetermined appropriate timing. Hereinafter, discussion will be made along the procedure of FIG. 2.

When a user switches on the information processing apparatus 1 which is a game machine and the game starts, the host system 2 sends a read command for reading a game program stored in the flash memory 4 to the memory controller 3 (Step S1). When the memory controller 3 receives the read command, the memory controller 3 reads the stored data of a game program which is specified out from the flash memory 4 and stores the stored data into the temporary memory part 7 as temporarily stored data (Step S2).

When the stored data is read out, the error correcting code corresponding to the stored data is also read out from the redundant area of the flash memory 4. The error correction part 8 checks if there is an error in the temporarily stored data on the basis of the error correcting code and if there is an error, the error correction part 8 corrects the error (Step S3).

Then, the temporarily stored data which is correct without any error is read out from the temporary memory part 7 by the host system 2 (Step S4).

Thus, even if the stored data which is stored in the flash memory 4 has an error, the error of the temporarily stored data is corrected by the error correction function in the normal read operation, and therefore the reliability of the data to be read out can be ensured. Then, by repeating this series of read operations, the game program is read out from the flash memory 4 and the user can enjoy the game.

Since the errors which occur in the flash memory 4, however, remain therein, when the number of errors increases with time and exceeds the error correction capability, the errors can not be corrected any more and there is a possibility that this may cause a trouble in the game. Further, even if the errors are corrected, since frequent suspension and delay of the game give very uncomfortable feelings to users, it is preferable that interruption in reading of the game program should be avoided. For this reason, the following complement function to repair the bit data without giving a stress to reading of the stored data is provided (Steps S5 to S9).

Specifically, if the error correction part 8 finds an error in the temporarily stored data, its error information is temporarily stored in the register 9 of the memory controller 3 (Step S5). This operation is associated with the foregoing operation of Step S3, and each time when an error is found, the error information is temporarily stored in the register 9 and accumulated therein. The error information refers to the page number or address of the page 10 in which the error is found, that is, information by which the stored data having an error is specified. Since the amount of the information is very small, the storage capacity of the register 9 for storing the information therein may be small.

When the information processing apparatus 1 is switched off, the error information which are temporarily stored in the register 9 are erased. For this reason, at a predetermined appropriate timing before the switch-off, the error information which are temporarily stored in the register 9 are read out by the host system 2 and stored into the nonvolatile memory 6 (Step S6).

The predetermined appropriate timing refers to a predetermined timing when no suspension or delay is caused in reading of the game program or a timing when no uncomfortable feeling is given to users even if there occurs suspension or delay in the game to some degree. This may be the timing when the error is found if there is no hitch in reading of the game program, but suitable timing is before power-off after the game is over such as the timing when the information processing apparatus 1 is switched off, during backup of data, during idling of the game program or the like.

Subsequently, an operation for repairing the bit errors is performed at predetermined appropriate timing (the bit error repair step). The bit error repair operation takes a relatively long time and during execution of this operation, the operation for reading the stored data can not be performed. For this reason, the error information is stored in the nonvolatile memory 6 in which the error information are not lost even if the information processing apparatus 1 is powered off and the operation for repairing the bit errors can be thereby performed at any timing such as at an appropriate timing before switch-off, at power-on, during charge of the information processing apparatus 1 or the like.

Among the above timings, it is preferable that the repair operation should be performed at power-on. In other words, if performed at power-on before execution of the game, it is possible to avoid giving any uncomfortable feeling to users even if the operation for repairing the bit errors is performed prior to the operation for reading the game program. Further, by repairing the errors in the flash memory 4 before the execution of the game, it is possible to effectively perform the error correction function in reading of the game program after that.

The bit error repair operation starts with the check on whether or not the error information is stored in the nonvolatile memory 6 of the host system 2. Then, if the error information is stored in the nonvolatile memory 6, the host system 2 sends a repair command giving an instruction to repair the bit errors existing in the flash memory 4 to the memory controller 3 (Step S7).

When the host system 2 sends the repair command to the memory controller 3, the stored data having an error is read out from the flash memory 4 into the temporary memory part 7 on the basis of the error information stored in the nonvolatile memory 6 (Step S8). The error in the temporarily stored data which is stored into the temporary memory part 7 is corrected by the error correction part 8 in an interlock manner with the read operation and the correct data is held in the temporary memory part 7. Then, the temporarily stored data with the error corrected is rewritten into the flash memory 4 (Step S9). If there are a plurality of error information, these series of operations are repeated. Then, when the series of operations on all the error information are completed, the error information stored in the nonvolatile memory 6 are erased (initialized).

Figure 3A:
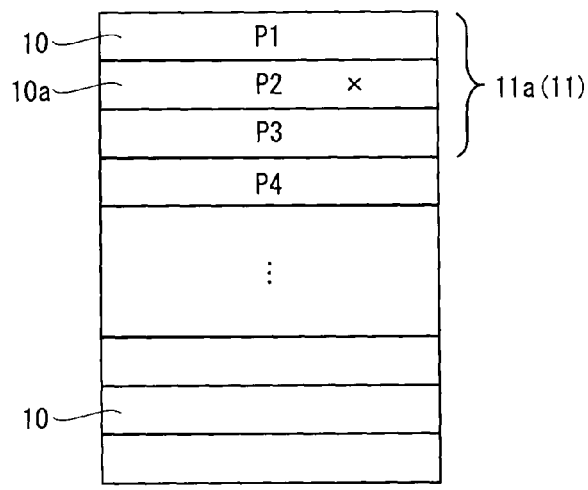
FIGS. 3A to 3C are views showing a structure of a memory area of a flash memory.
Figure 3B:
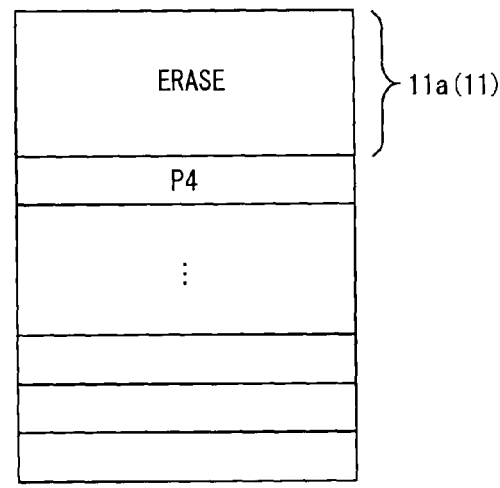
Figure 3C:
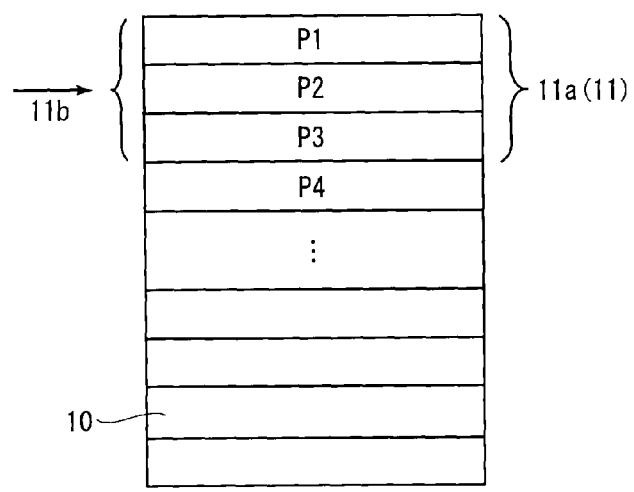

Next, specific discussion will be made on a rewrite operation. FIGS. 3A to 3C are views showing the memory area of the flash memory 4. As described earlier, the memory area of the flash memory 4 consists of pages 10 each of which is a unit of writing and reading and blocks 11 consists of a plurality of pages 10 and is a unit of erasing the stored data. In other words, the flash memory 4 can only collectively erase the stored data by the block and data can be written into only the unused areas with data erased. It is impossible to rewrite only the page in which an error occurs without erasing other pages in the same block.

Herein, for convenience of discussion, as shown in FIG. 3A, it is assumed that one block 11a consists of a plurality of pages 10 of P1 to P3 and the page 10a of P2 has an error.

As one of the rewrite operations, as shown in FIG. 3B, the stored data in the block 11a including the page 10a of P2 having an error is temporarily stored in one of other memory devices in the information processing apparatus 1 including the temporary memory part 7 and the stored data in the block 11a is collectively erased. Then, as shown in FIG. 3C, a block data 11b including new pages 10 of P1 to P3 with its error corrected are written into the block 11a after erasing. Especially, since the pages 10 which are positioned around the original page 10a of P2 and potentially have a possibility of occurrence of bit errors are also rewritten at the same time to recover the bit data, this is an effective method of preventing the bit errors.

Figure 4:
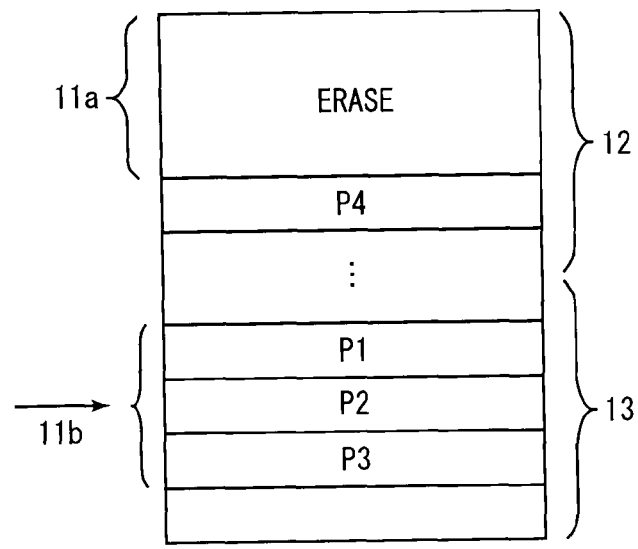
FIG. 4 is a view showing a structure of the memory area of the flash memory.
Figure 5:
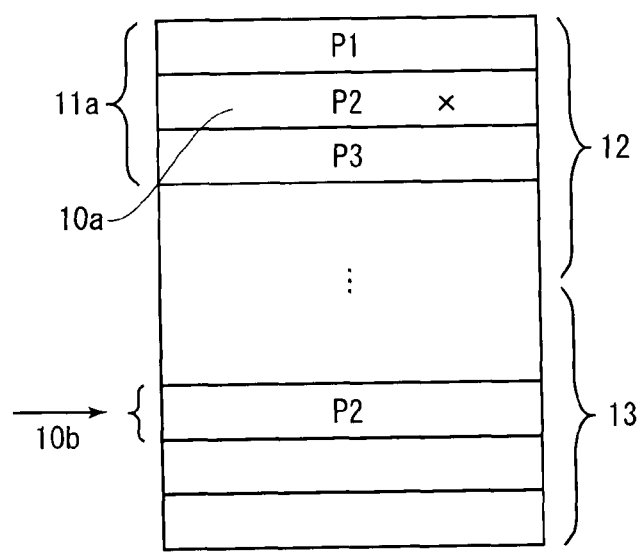
FIG. 5 is a view showing a structure of the memory area of the flash memory.
Figure 6:
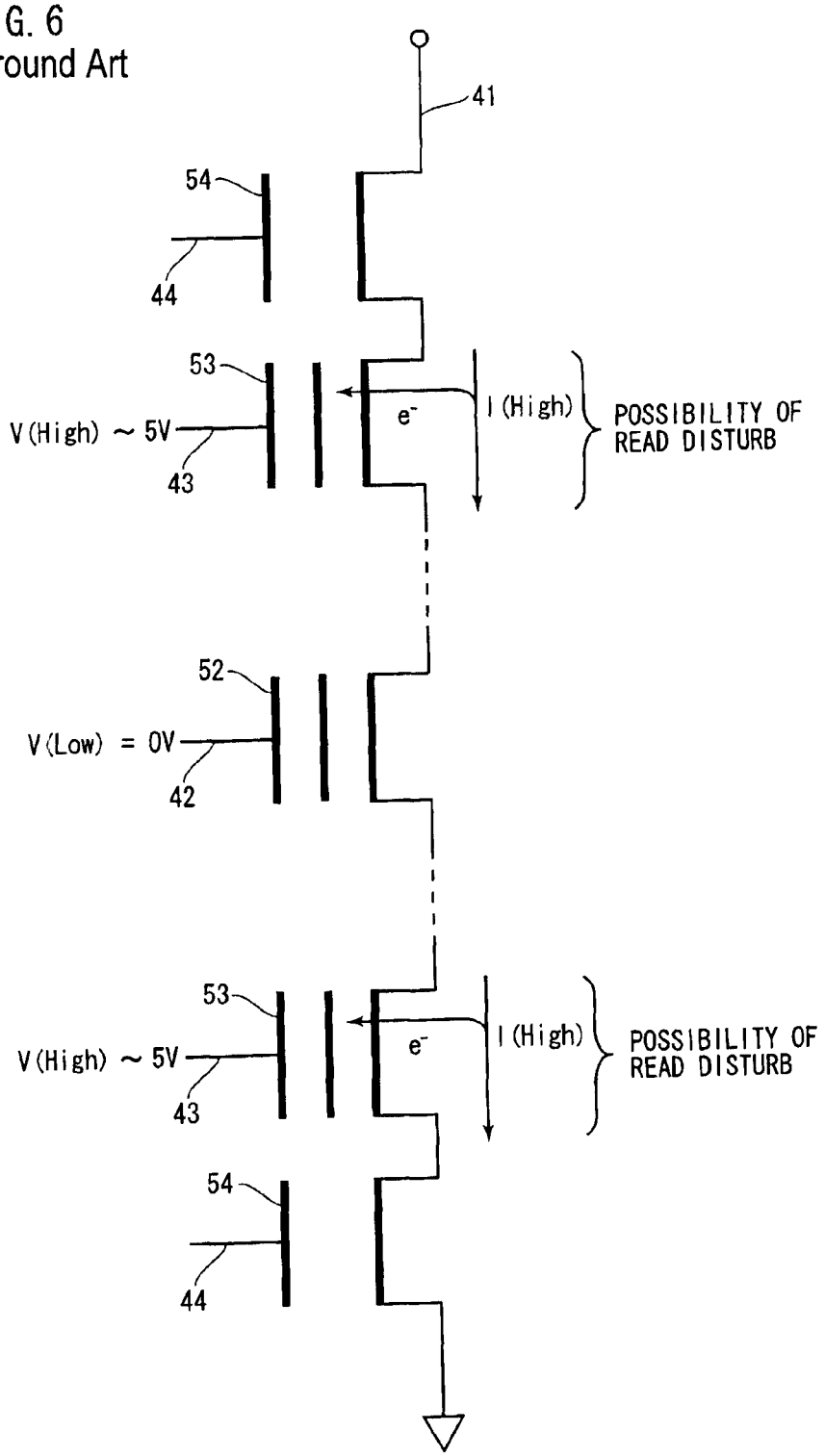
FIG. 6 is a view for discussion on a read disturb.

FIGS. 4 and 5 are views showing a rewrite operation using the unused area 13 in the flash memory 4. In this case, in the information processing apparatus 1 provided is a management part for managing storage information of the stored data which is stored in the flash memory 4, such as FAT or the like.

FIG. 4 is a view showing an operation by the block. The block data 11b including the new pages of P1 to P3 with its error corrected is stored into the unused area 13 and the management part modifies the storage information to change the execution of reading the pages 10 to the execution of reading the new pages 10. This is advantageous in that the operation efficiency increases since it is not necessary to temporarily store the pages 10 by the block. Since the original block 11a can be reused by erasing even in the use area 12, another data may be stored into it or the new pages of P1 to P3 which are stored in the unused area 13 may be rewritten into the original block 11a again.

FIG. 5 is a view showing an operation by the page. In this case, the operation may not be performed by the block. Specifically, the temporarily stored data in the page 10a of P2 which is stored in the temporary memory part 7 and whose error is corrected is written into the unused area 13 as a new page 10b of P2. Then, the management part modifies the storage information to change the execution of reading the original page 10a of P2 to the execution of reading the new page 10b of P2.

Thus, in the normal state of usage, since the reliability of data to be read out is ensured with the error correction function, even if the stored data has an error, the game or the like implemented by the data can operate appropriately and smoothly. Then, by providing a mechanism to repair recoverable bit errors as appropriate as a function complementing the error correction function, it becomes possible to reduce the risk that errors might exceed the error correction capability and further improve the reliability of the flash memory 4.

Further, it is possible to repair the bit errors at an appropriate timing by storing the error information in the nonvolatile memory 6 and so on, and this avoids giving any uncomfortable feeling to users due to the suspension or delay of the game caused by the repair operation.

Though the above discussion of this preferred embodiment has been made on the case where the error information is stored in the nonvolatile memory 6 through the register 9, the register 9 is not an essential part. The error information may be stored in the nonvolatile memory 6 directly.

There may be a case where the nonvolatile memory 6 is provided in the storage medium 5 and the memory controller 3 performs the bit error repair operation. Existing storage means such as an EEPROM mounted on the storage medium 5, a flash memory mounted as a backup device or the like can be effectively used as the nonvolatile memory 6.

The unused area 13 in the first nonvolatile semiconductor memory 4 may be used as the nonvolatile memory 6. Specifically, in the above preferred embodiment, instead of the nonvolatile memory 6, the error information which is temporarily stored in the register 9 is stored into the unused area 13 of the flash memory 4. This eliminates the necessity of additionally providing the nonvolatile memory 6 and this is advantageous in cost or the like.

The error correction part 8 does not necessarily have to be provided in the memory controller 3 but has only to be provided in any constituent element of the information processing apparatus 1, such as the host system 2 or the like.

If the information processing apparatus 1 comprises any means to access a network, storage means provided on the network, such as a dedicated server or the like, may be used instead of the nonvolatile memory 6.

While the invention has been shown and described in detail, the foregoing description is in all aspects illustrative and not restrictive. It is therefore understood that numerous modifications and variations can be devised without departing from the scope of the invention.

What is claimed is:

1. A method of repairing a bit error which occurs due to a change of bit data stored in a first nonvolatile semiconductor memory, comprising:
    a) temporarily storing data which is stored in said first nonvolatile semiconductor memory when said data is read by a host system;
    b) judging whether an error exists in said temporarily stored data and correcting the error if there is;
    c) temporarily storing, into a storage part, error information that identifies a page of the first nonvolatile semiconductor memory corresponding to the temporarily stored data;
    d) in response to an instruction by the host system, storing said error information from the storage part into at least one of an unused area in said first nonvolatile semiconductor memory and a second nonvolatile semiconductor memory at such a predetermined timing that no suspension or delay occurs in reading of data by the host system;
    e) once at a predetermined timing, reading, from the first nonvolatile semiconductor memory, a block of data including the page of the first nonvolatile semiconductor memory identified in the error information, correcting the error, and then rewriting said block of data with the corrected error into said first nonvolatile semiconductor memory; and
    f) deleting the error information from at least one of the unused area in said first nonvolatile semiconductor memory and the second nonvolatile semiconductor memory.

2. The method according to claim 1, wherein said step e) is performed at power-on.

3. The method according to claim 1, wherein said bit error includes a read disturb error.

4. An information processing apparatus, comprising:
a first nonvolatile semiconductor memory;
a second nonvolatile semiconductor memory;
a host system to read stored data stored in said first nonvolatile semiconductor memory;
an error correction part to judge whether a bit error exists in said stored data when said stored data is read by said host system and correcting the error if there is; and
a memory controller provided between said first nonvolatile semiconductor memory and said host system, wherein said memory controller includes
a temporary memory part to temporarily store said stored data as temporarily stored data; and
a storage part to temporarily store error information that identifies a page of the first nonvolatile memory corresponding to said temporarily stored data therein, and
in response to an instruction by the host system, said error information temporarily stored in said storage part is stored into at least one of an unused area in said first nonvolatile semiconductor memory and said second nonvolatile semiconductor memory at such a predetermined timing that no suspension or delay occurs in reading of data by the host system,
once at a predetermined timing, said information processing apparatus reads, from the first nonvolatile semiconductor memory, a block of data including the page of the first nonvolatile semiconductor memory identified in the error information, corrects the error, and then rewrites said block of data with the corrected error into said first nonvolatile semiconductor memory, and
the information processing apparatus deletes the error information from at least one of the unused area in said first nonvolatile semiconductor memory and the second nonvolatile semiconductor memory.

5. The information processing apparatus according to claim 4, wherein said bit error is repaired at power-on.

6. The information processing apparatus according to claim 4, wherein said bit error includes a read disturb error.

7. A method of repairing a bit error which occurs due to a change of bit data stored in a first nonvolatile semiconductor memory, comprising:
a) temporarily storing data which is stored in said first nonvolatile semiconductor memory when said data is read by a host system;
b) judging whether an error exists in said temporarily stored data and correcting the error if there is;
c) temporarily storing, into a storage part, error information that identifies a page of the first nonvolatile semiconductor memory corresponding to the temporarily stored data;
d) in response to an instruction by the host system, storing said error information from the storage part into an unused area in said first nonvolatile semiconductor memory at such a predetermined timing that no suspension or delay occurs in reading of data by the host system;
e) once at a predetermined timing, reading, from the first nonvolatile semiconductor memory, a block of data including the page of the first nonvolatile semiconductor memory identified in the error information, correcting the error, and then rewriting said block of data with the corrected error into said first nonvolatile semiconductor memory; and
f) deleting the error information from said unused area in said first nonvolatile semiconductor memory.

8. An information processing apparatus, comprising:
a first nonvolatile semiconductor memory;
a host system to read stored data stored in said first nonvolatile semiconductor memory;
an error correction part to judge whether a bit error exists in said stored data when said stored data is read by said host system and correcting the error if there is; and
a memory controller provided between said first nonvolatile semiconductor memory and said host system, wherein said memory controller includes
a temporary memory part to temporarily store said stored data as temporarily stored data; and
a storage part to temporarily store error information that identifies a page of the first nonvolatile memory corresponding to said temporarily stored data therein, and
in response to an instruction by the host system, said error information temporarily stored in said storage part is stored into an unused area in said first nonvolatile semiconductor memory at such a predetermined timing that no suspension or delay occurs in reading of data by the host system,
once at a predetermined timing, said information processing apparatus reads, from the first nonvolatile semiconductor memory, a block of data including the page of the first nonvolatile semiconductor memory identified in the error information, corrects the error, and then rewrites said block of data with the corrected error into said first nonvolatile semiconductor memory, and
the information processing apparatus deletes the error information from the unused area in said first nonvolatile semiconductor memory.

9. A method of repairing a bit error which occurs due to a change of bit data stored in a first nonvolatile semiconductor memory, comprising:
a) temporarily storing data which is stored in said first nonvolatile semiconductor memory when said data is read by a host system;
b) judging whether an error exists in said temporarily stored data and correcting the error if there is;
c) temporarily storing, into a storage part, error information that identifies a page of the first nonvolatile semiconductor memory corresponding to the temporarily stored data;
d) in response to an instruction by the host system, storing said error information from the storage part into at least one of an unused area in said first nonvolatile semiconductor memory and a second nonvolatile semiconductor memory at such a predetermined timing that no suspension or delay occurs in reading of data by the host system;
e) once at a predetermined timing, reading, from the first nonvolatile semiconductor memory, data of the page identified in the error information, correcting the error, and then rewriting said data of the page with the corrected error into an unused area of said first nonvolatile semiconductor memory; and
f) deleting the error information from at least one of the unused area in said first nonvolatile semiconductor memory and the second nonvolatile semiconductor memory.

10. A method of repairing a bit error which occurs due to a change of bit data stored in a first nonvolatile semiconductor memory, comprising:
a) temporarily storing data which is stored in said first nonvolatile semiconductor memory when said data is read by a host system;

b) judging whether an error exists in said temporarily stored data and correcting the error if there is;
c) temporarily storing, into a storage part, error information that identifies a page of the first nonvolatile semiconductor memory corresponding to the temporarily stored data;
d) in response to an instruction by the host system, storing said error information from the storage part into an unused area in said first nonvolatile semiconductor memory at such a predetermined timing that no suspension or delay occurs in reading of data by the host system;
e) once at a predetermined timing, reading, from the first nonvolatile semiconductor memory, data of the page identified in the error information, correcting the error, and then rewriting said data of the page with the corrected error into an unused area of said first nonvolatile semiconductor memory; and
f) deleting the error information from the unused area in said first nonvolatile semiconductor memory.

11. An information processing apparatus, comprising:
a first nonvolatile semiconductor memory;
a second nonvolatile semiconductor memory;
a host system to read stored data stored in said first nonvolatile semiconductor memory;
an error correction part to judge whether a bit error exists in said stored data when said stored data is read by said host system and correcting the error if there is; and
a memory controller provided between said first nonvolatile semiconductor memory and said host system, wherein said memory controller includes
  a temporary memory part to temporarily store said stored data as temporarily stored data; and
  a storage part to temporarily store error information that identifies a page of the first nonvolatile memory corresponding to said temporarily stored data therein, and
in response to an instruction by the host system, said error information temporarily stored in said storage part is stored into at least one of an unused area in said first nonvolatile semiconductor memory and said second nonvolatile semiconductor memory at such a predetermined timing that no suspension or delay occurs in reading of data by the host system,
once at a predetermined timing, said information processing apparatus reads, from the first nonvolatile semiconductor memory, data of the page identified in the error information, corrects the error, and then rewrites the data of the page with the corrected error into an unused area of said first nonvolatile semiconductor memory, and
the information processing apparatus deletes the error information from at least one of the unused area in said first nonvolatile semiconductor memory and the second nonvolatile semiconductor memory.

12. An information processing apparatus, comprising:
a first nonvolatile semiconductor memory;
a host system to read stored data stored in said first nonvolatile semiconductor memory;
an error correction part to judge whether a bit error exists in said stored data when said stored data is read by said host system and correcting the error if there is; and
a memory controller provided between said first nonvolatile semiconductor memory and said host system, wherein said memory controller includes
  a temporary memory part to temporarily store said stored data as temporarily stored data; and
  a storage part to temporarily store error information that identifies a page of the first nonvolatile memory corresponding to said temporarily stored data therein, and
in response to an instruction by the host system, said error information temporarily stored in said storage part is stored into an unused area in said first nonvolatile semiconductor memory at such a predetermined timing that no suspension or delay occurs in reading of data by the host system,
once at a predetermined timing, said information processing apparatus reads, from the first nonvolatile semiconductor memory, data of the page identified in the error information, corrects the error, and then rewrites the data of the page with the corrected error into an unused area of said first nonvolatile semiconductor memory, and
the information processing apparatus deletes the error information from the unused area in said first nonvolatile semiconductor memory.

* * * * *